United States Patent
Pugh et al.

(10) Patent No.: US 9,425,571 B2
(45) Date of Patent: Aug. 23, 2016

(54) METHODS AND APPARATUS TO FORM ELECTRICAL INTERCONNECTS ON OPHTHALMIC DEVICES

(71) Applicant: Johnson & Johnson Vision Care, Inc., Jacksonville, FL (US)

(72) Inventors: Randall B. Pugh, Jacksonville, FL (US); Daniel B. Otts, Fruit Cove, FL (US); Praveen Pandojirao-S, Jacksonville, FL (US); Adam Toner, Jacksonville, FL (US); James Daniel Riall, St. Johns, FL (US); Edward R. Kernick, Jacksonville, FL (US); Stephen R. Beaton, Jacksonville, FL (US); Frederick A. Flitsch, New Windsor, NY (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 170 days.

(21) Appl. No.: 13/687,073

(22) Filed: Nov. 28, 2012

(65) Prior Publication Data
US 2013/0174978 A1   Jul. 11, 2013

Related U.S. Application Data

(60) Provisional application No. 61/583,693, filed on Jan. 6, 2012.

(51) Int. Cl.
*H01R 43/00* (2006.01)
*B29D 11/00* (2006.01)
(Continued)

(52) U.S. Cl.
CPC .......... *H01R 43/00* (2013.01); *B29D 11/00807* (2013.01); *H05K 3/027* (2013.01); *H05K 1/0284* (2013.01); *H05K 3/0035* (2013.01); *H05K 3/143* (2013.01); *H05K 2203/107* (2013.01)

(58) Field of Classification Search
CPC ................... B29D 11/00807; B29D 11/00442; B29D 11/00413; H05K 3/027; H05K 1/0284; H05K 3/0026; H05K 3/0035; H05K 2203/107; H05K 3/143; H05K 1/119; H01R 43/00; H01R 43/20; B29C 2035/0827; B29C 35/0888; B29C 2791/001; B29C 37/0032; B29C 41/045; G02C 7/04; G02C 7/10; A61F 9/022
See application file for complete search history.

(56) References Cited

U.S. PATENT DOCUMENTS 4,427,396 A * 1/1984 van den Berg .......... H01J 9/142
                                                                148/650
4,662,720 A * 5/1987 Fergason ...................... 349/105
(Continued)

FOREIGN PATENT DOCUMENTS

EP          2184127 A1    10/2009
WO    WO 03/055636 A1     7/2003
(Continued)

OTHER PUBLICATIONS

Search Report dated Jun. 21, 2013 for corresponding Singapore Patent Application No. 201209385-2.
(Continued)

*Primary Examiner* — David Turocy
*Assistant Examiner* — Mohammad Mayy
(74) *Attorney, Agent, or Firm* — Carl J. Evens

(57) ABSTRACT

Methods and apparatus for forming interconnects on the surfaces of three dimensional substrates, including ophthalmic devices incorporating one or more electrical components may be utilized to provide high quality electrical and mechanical connections.

1 Claim, 16 Drawing Sheets

(51) Int. Cl.
  *H05K 3/02*  (2006.01)
  *H05K 1/02*  (2006.01)
  *H05K 3/00*  (2006.01)
  *H05K 3/14*  (2006.01)

(56) References Cited

U.S. PATENT DOCUMENTS

| | | | |
|---|---|---|---|
| 4,983,250 A * | 1/1991 | Pan | 216/19 |
| 5,573,875 A * | 11/1996 | Kaplan et al. | 430/5 |
| 6,485,839 B1 * | 11/2002 | Nagarkar et al. | 428/461 |
| 7,176,053 B1 * | 2/2007 | Dimmler | 438/99 |
| 7,370,963 B2 * | 5/2008 | Cano et al. | 351/159.6 |
| 7,423,801 B2 * | 9/2008 | Kaufman et al. | 359/319 |
| 8,115,792 B2 | 2/2012 | Petsch et al. | |
| 2002/0092833 A1 * | 7/2002 | Lipman et al. | 219/121.7 |
| 2002/0095780 A1 * | 7/2002 | Shadle et al. | 29/623.5 |
| 2004/0157716 A1 * | 8/2004 | Echerer | B65H 45/18 492/30 |
| 2006/0013970 A1 * | 1/2006 | Wada | 428/32.24 |
| 2006/0286707 A1 * | 12/2006 | Hooper et al. | 438/52 |
| 2007/0058260 A1 * | 3/2007 | Steenblik et al. | 359/626 |
| 2007/0188710 A1 * | 8/2007 | Hetling | A61B 5/0496 351/221 |
| 2008/0213473 A1 | 9/2008 | Roisin et al. | |
| 2009/0168014 A1 | 7/2009 | Rooney et al. | |
| 2010/0788838 | 4/2010 | Pugh et al. | |
| 2012/0013845 A1 | 1/2012 | Conte et al. | |
| 2012/0140167 A1 * | 6/2012 | Blum | A61F 2/1624 351/159.34 |

FOREIGN PATENT DOCUMENTS

| | | |
|---|---|---|
| WO | WO 2010/054204 A2 | 5/2010 |
| WO | WO 2010/109154 A1 | 9/2010 |

OTHER PUBLICATIONS

Partial European Search Report for Application No. EP13150317 dated Oct. 2, 2013.

* cited by examiner

METHODS AND APPARATUS TO FORM ELECTRICAL INTERCONNECTS ON OPHTHALMIC DEVICES

CROSS REFERENCE TO RELATED APPLICATIONS

This patent application claims the benefit of U.S. Patent Application Ser. No. 61/583,693, filed Jan. 6, 2012.

BACKGROUND OF THE INVENTION

1. Field of the Invention

The present invention relates to methods and apparatus for forming a device whereon electrical interconnections are configured to connect and physically support attached components or combinations of components. More particularly, the present invention relates to methods and apparatus for forming interconnects on the surfaces of three dimensional substrates, including ophthalmic devices incorporating one or more electrical components.

2. Discussion of the Related Art

Traditionally an ophthalmic device, such as a contact lens, an intraocular lens or a punctal plug included a biocompatible device with a corrective, cosmetic or therapeutic quality. A contact lens, for example, may provide at least one of vision correcting functionality, cosmetic enhancement, and therapeutic effects. Each function is provided by a physical characteristic of the lens. A design incorporating a refractive quality into a lens may provide a vision corrective function. A pigment incorporated into the lens may provide a cosmetic enhancement. An active agent incorporated into a lens may provide a therapeutic functionality. Such physical characteristics are accomplished without the lens entering into an energized state. Punctal plugs are devices which are placed in the lacrimal punctum to treat dry eye. Punctal plugs may comprise reservoirs for the local delivery of a therapeutic agent. A punctal plug has traditionally been a passive device.

More recently, it has been theorized that active components may be incorporated into ophthalmic devices such as a contact lens. Some components may include semiconductor devices. Some examples have shown semiconductor devices embedded in a contact lens placed upon animal eyes. It has also been described how the active components may be energized and activated in numerous manners within the lens structure itself. The topology and size of the space defined by the lens structure creates a novel and challenging environment for the definition of various functionality. It is important to provide reliable, compact and cost effective means to interconnect and attach the components upon form factors consistent with the ophthalmic environment.

Given the area and volume constraints of an ophthalmic device such as a contact lens and the environment in which it is to be utilized, the physical realization of the device must overcome a number of problems, including mounting and interconnecting a number of electronic components on a non-planar surface, the bulk of which comprise optical plastic. Accordingly, there exists a need for providing a mechanically and electrically robust electronic contact lens and a method and apparatus for forming the interconnections.

SUMMARY OF THE INVENTION

In accordance with a first aspect, the present invention is directed to electrical interconnects upon a three dimensional surface. The electrical interconnects comprises forming a three dimensional substrate base from a first insulating material, depositing a conductive film upon at least a portion of the surface of the three dimensional substrate base, and forming electrical interconnect lines from the conductive film by laser ablating surrounding conductive film material.

In accordance with another aspect, the present invention is directed to a method for forming electrical interconnects upon a three dimensional surface. The method comprises forming a three dimensional substrate from a first insulating material, forming a three dimensional mask from a second material, wherein the three dimensional mask may closely fit upon the three dimensional substrate, creating perforations through regions of the three dimensional mask by laser micromachining, placing the three dimensional mask upon the three dimensional substrate and depositing a conductive film upon the combined three dimensional mask and three dimensional substrate.

In accordance with yet another aspect, the present invention is directed to a method for forming electrical interconnects upon a three dimensional surface. The method comprises forming an essentially planar first substrate from a first insulating material, depositing a first conductive material upon the first insulating material, forming electrical interconnect features by removing regions of first conductive material, placing an overlying layer of the first insulating material upon the electrical interconnect features, forming the first planar substrate, electrical interconnect features and overlying layer of first insulating material into a second planar substrate, and forming the second planar substrate into a first three dimensional substrate with incorporated electrical interconnects.

In accordance with still another aspect, the present invention is directed to a method for forming electrical interconnects upon a three dimensional surface. The method comprises forming an essentially planar first substrate from a first insulating material, forming masking penetrations in the first substrate by removing regions of first insulating material, forming a mask template by cutting said template out of the first planar substrate, folding the mask template to join its end regions wherein the folding creates a three dimensional mask, placing the three dimensional mask upon a three dimensional substrate, and depositing a conductive film upon the combined three dimensional mask and three dimensional substrate.

The methods and apparatus to form electrical interconnects on ophthalmic devices of the present invention overcomes the disadvantages associated with the prior art as briefly described above.

The present invention includes methods and apparatus to define or configure electrical interconnections upon formed three dimensional shapes which may be included as inserts into a finished ophthalmic device. It is important to note although the invention is described with respect to ophthalmic devices, the present invention may be generally utilized to make interconnections on any three dimensional substrates.

In some exemplary embodiments, an insert is provided that may be energized and incorporated into an ophthalmic device. The insert may be formed in a number of manners to result in a three dimensional shape upon which electrical interconnections may be formed. In some exemplary embodiments, the interconnections may be simultaneously included during the process of forming the insert. In other exemplary embodiments, the interconnects may be formed by depositing the various films and then processing them to result in interconnections upon the surface of the insert. Still further exemplary embodiments may be realized when interconnects formed upon the surface of the three dimensional inserts are encapsulated with insulating materials which are then opened in defined locations to form connection vias for the interconnection.

An important equipment aspect of the methods and apparatus to form electrical interconnections on three dimensional surfaces may include the use of laser tooling. In some exemplary embodiments the laser tooling may be useful to ablate or remove regions of a metallic film or an insulating film in a controllable and programmable manner. In other exemplary embodiments, the laser tooling may be useful to ablate material in appropriately defined three dimensional shapes which will act in the process of creating mask entities for defining the location of interconnects. In some exemplary embodiments, the masks may act as shadow masks, which allow the deposition of films upon insert surfaces only where the mask has penetrations within itself. There may be numerous films that may be consistent with masked deposition, including metallic films, dielectric films, high-k dielectric films, conductive and non-conductive epoxies and other conductive and non-conductive films which may be applied in any suitable manner including a spraying process. In other exemplary embodiments, the masks may be useful for intercepting and imaging light of various forms which may be important to lithographic processes which may include plasma and reactive ion etching, wet chemical etching and other such techniques useful for forming defined interconnections.

In some exemplary embodiments, the interconnections upon the insert may allow for the connection of a component which may exist in an energized state which is capable of powering other components capable of drawing a current by connection through the defined interconnection. Components may include one or more of a variable optic lens element and a semiconductor device, which may either be located upon or in the insert or otherwise connected to it.

Other exemplary embodiments may include a cast molded silicone hydrogel contact lens with a rigid or formable insert upon which interconnections have been configured and which may also comprise an ophthalmic lens.

The present invention includes a disclosure of a technological framework for forming and defining and/or configuring interconnections upon three dimensional surfaces. In exemplary embodiments, disclosure is made for an ophthalmic lens with an insert upon which components are attached and interconnected by metal lines defined upon the surface of the insert, an apparatus for forming an ophthalmic lens with electrical interconnections defined upon three dimensional surfaces, and methods for making the same.

BRIEF DESCRIPTION OF THE DRAWINGS

The foregoing and other features and advantages of the invention will be apparent from the following, more particular description of preferred embodiments of the invention, as illustrated in the accompanying drawings.

DETAILED DESCRIPTION OF THE PREFERRED EMBODIMENTS

Figure 1:
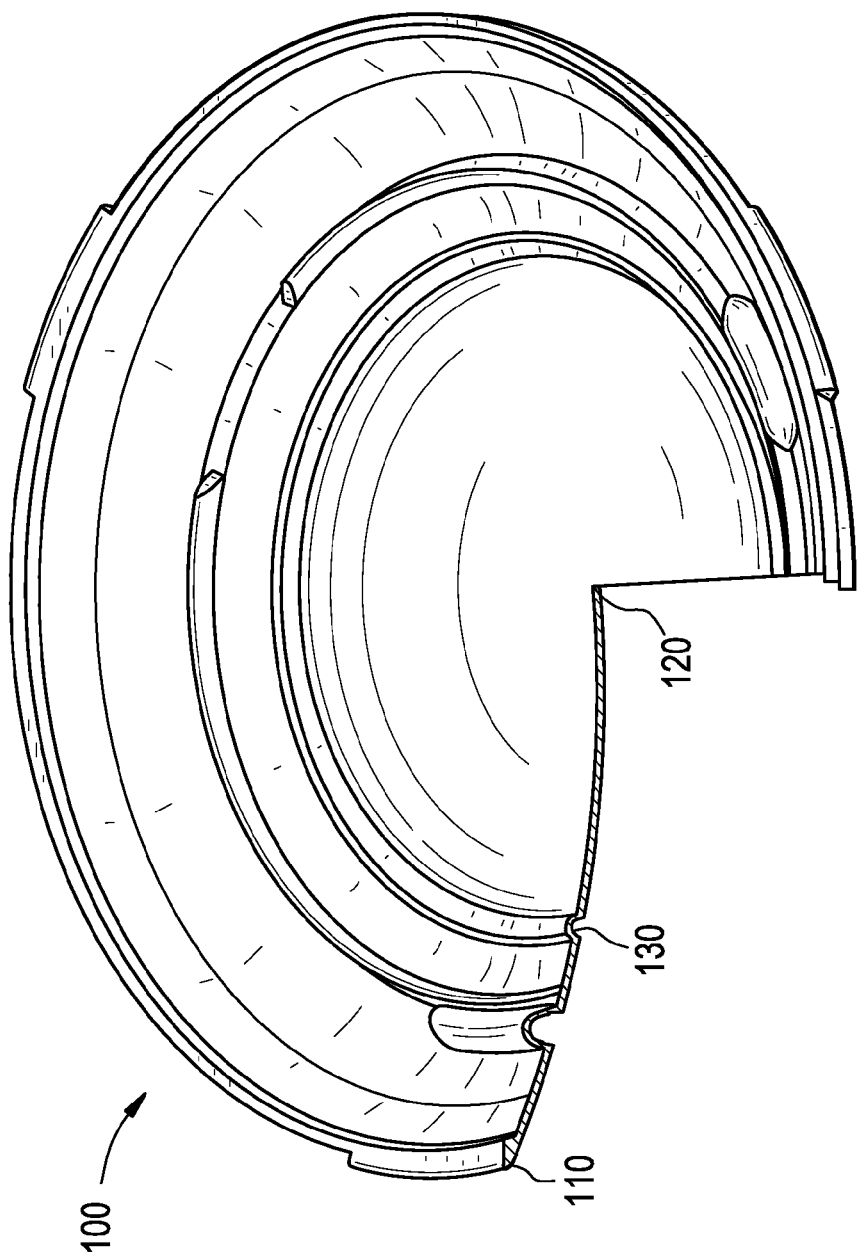
FIG. 1 illustrates an exemplary substrate with three dimensional surfaces upon which interconnections may be configured in accordance with the present invention.

The present invention relates to methods and apparatus useful in the formation of electrical interconnects upon surfaces that have three dimensional topology. In the following sections, detailed descriptions of exemplary embodiments of the invention will be given. The description of both preferred and alternative embodiments are exemplary embodiments only, and it is understood that to those skilled in the art that variations, modifications and alterations may be apparent. It is therefore to be understood that the exemplary embodiments do not limit the scope of the underlying invention.

DEFINITIONS

In this detailed description and claims directed to the present invention, various terms may be used for which the following definitions will apply.

As used herein, the term "energized" refers to the state of being able to supply electrical current to or to have electrical energy stored within.

As used herein, the term "energy" refers to the capacity of a physical system to do work. Many uses within the present invention may relate to the capacity of being able to perform electrical actions in doing work.

As used herein, the term "energy source" refers to a device or a layer which is capable of supplying energy or placing a logical or electrical device in an energized state.

As used herein, the term "energy harvester" refers to devices capable of extracting energy from the environment and converting it to electrical energy.

As used herein, the term "functionalized" refers to making a layer or device able to perform a function, for example, energization, activation, or control.

As used herein, the term "lens" refers to any ophthalmic device that resides in or on the eye. These devices may provide optical correction and/or may be cosmetic in nature. For example, the term lens may refer to a contact lens, intraocular lens, overlay lens, ocular insert, optical insert or other similar device through which vision is corrected or modified, or through which eye physiology is cosmetically enhanced, e.g. iris color, without impeding vision. In some exemplary embodiments, the preferred lenses of the invention are soft contact lenses that are made from silicone elastomers or hydrogels, which include silicone hydrogels, and fluorohydrogels.

As used herein, the terms "lens forming mixture", "reactive mixture" or "reactive monomer mixture" (RRM) each refers to a monomer or prepolymer material which may be cured and crosslinked or crosslinked to form an ophthalmic lens. Various exemplary embodiments may include lens forming mixtures with one or more additives, including UV blockers, tints, photoinitiators or catalysts, and other additives one might desire in an ophthalmic lenses such as, contact or intraocular lenses.

As used herein, the term "lens forming surface" refers to a surface that is used to mold a lens. In some exemplary embodiments, any such surface may have an optical quality surface finish, which indicates that it is sufficiently smooth and formed so that a lens surface fashioned by the polymerization of a lens forming material in contact with the molding surface is optically acceptable. Further, in some exemplary embodiments, the lens forming surface may have a geometry that is necessary to impart to the lens surface the desired optical characteristics, including without limitation, spherical, aspherical and cylinder power, wave front aberration correction, corneal topography correction and the like as well as any combinations thereof.

As used herein, the term "lithium ion cell" refers to an electrochemical cell where lithium ions move through the cell to generate electrical energy. This electrochemical cell, typically called a battery, may be reenergized or recharged in its typical forms.

As used herein, the term "substrate insert" refers to a formable or rigid substrate capable of supporting an energy source within an ophthalmic lens. In some exemplary embodiments, the substrate insert also supports one or more components.

As used herein, the term "mold" refers to a rigid or semi-rigid object that may be used to form lenses from uncured formulations. Some preferred molds include two mold parts forming a front curve mold part and a back curve mold part.

As used herein, the term "optical zone" refers to an area of an ophthalmic lens through which a wearer of the ophthalmic lens sees.

As used herein, the term "power" refers to work done or energy transferred per unit of time.

As used herein, the terms "rechargeable" or "re-energizable" are utilized interchangeably and refers to a capability of being restored to a state with higher capacity to do work. Many uses within the present invention may relate to the capability of being restored with the ability to flow electrical current at a certain rate for a certain, reestablished time period.

As used herein, the terms "reenergize" or "recharge" are interchangeable and refer to the ability to restore to a state with higher capacity to do work. Many uses within the present invention may relate to restoring a device to the capability to flow electrical current at a certain rate for a certain, reestablished time period.

As used herein, the term "released from a mold" means that a lens is either completely separated from the mold, or is only loosely attached so that it may be removed with mild agitation or pushed off with a swab.

As used herein, the term "stacked" means to place at least two component layers in proximity to each other such that at least a portion of one surface of one of the layers contacts a first surface of a second layer. In some exemplary embodiments, a film, whether for adhesion or other functions may reside between the two layers that are in contact with each other through said film.

As used herein, the term "stacked integrated component devices" (SIC-Devices) refers to the product of packaging technologies that may assemble thin layers of substrates, which may comprise electrical and electromechanical devices, into operative integrated devices by means of stacking at least a portion of each layer upon each other. The layers may comprise component devices of various types, materials, shapes, and sizes. Furthermore, the layers may be made of various device production technologies to fit and assume various contours as it may be desired.

Forming a Three Dimensional Shape

The present invention is directed to methods and apparatus for forming interconnects on the surface of three dimensional substrates, including ophthalmic devices incorporating one or more electrical components. Referring to FIG. 1, there is illustrated an exemplary three dimensional substrate 100. The particular structure, may in some exemplary embodiments, relate to a portion of an insert that may be included in an ophthalmic lens. The figure demonstrates a number of attributes of the three dimensional aspect of the defined substrate by depicting a cross sectional cut across the left portion of the substrate. Element 110 may be characterized as the outer most edge of the insert shape while element 120 may show the central point of the shape. In typical exemplary embodiments of such a shape for ophthalmic devices, the difference in height from the center to the edge may vary up to four (4) millimeters defining a three dimensional global shape. In addition, as shown by element 130, there may occur local features within a three dimensional shape that also have three dimensional topology, as this locally raised feature depicts. These ridges or raised features may vary in dimension significantly and may include feature heights from 0.001 to 0.5 mm and the slope of the sidewalls generated by the features may vary from two (2) to ninety (90) degrees. The embodiments of these exemplary features may be useful in providing a description of the present invention; however, as may be apparent to one skilled in the relevant art there may exist a wide diversity of three dimensional substrates and the characteristics of their surfaces that are consistent with the descriptions provided.

Such an object as item 100 defines many of the key characteristics that are important when defining interconnection features on the surface of three dimensionally formed substrates. Nevertheless, while exemplary embodiments focused on the methods and apparatus to form interconnections upon surfaces of a three dimensionally formed ophthalmic insert will be described in detail, these descriptions should not limit the scope of the inventive art as many arbitrarily shaped three dimensional substrates may be processed with the methods and apparatus described herein to form functional results.

There may be numerous means and methods for producing a three dimensionally formed substrate of the type shown as element 100. In some exemplary embodiments, an injection molding technique may be used to form the object. Other exemplary embodiments may be defined by forming of various materials, like plastic films, for example, where thermal heating of plastic sheets and pressure from mold forming parts form the plastic sheets into three dimensional shapes. Other exemplary embodiments may involve the stamping of metallic films or electroforming of metallic materials into three dimensional shapes, for example, and then coating such a product with an insulating material so that discrete electrical interconnects may be formed thereon. Other processes that may form three dimensionally shaped products like stereolithography and voxel-based lithography may be consistent with the art described herein. It may be apparent to one skilled in the arts that any method that defines a three dimensional shape which is either made of an electrically insulative material or may be coated with an electrically insulative material may comprise art consistent with the scope of the present invention.

Figure 2:
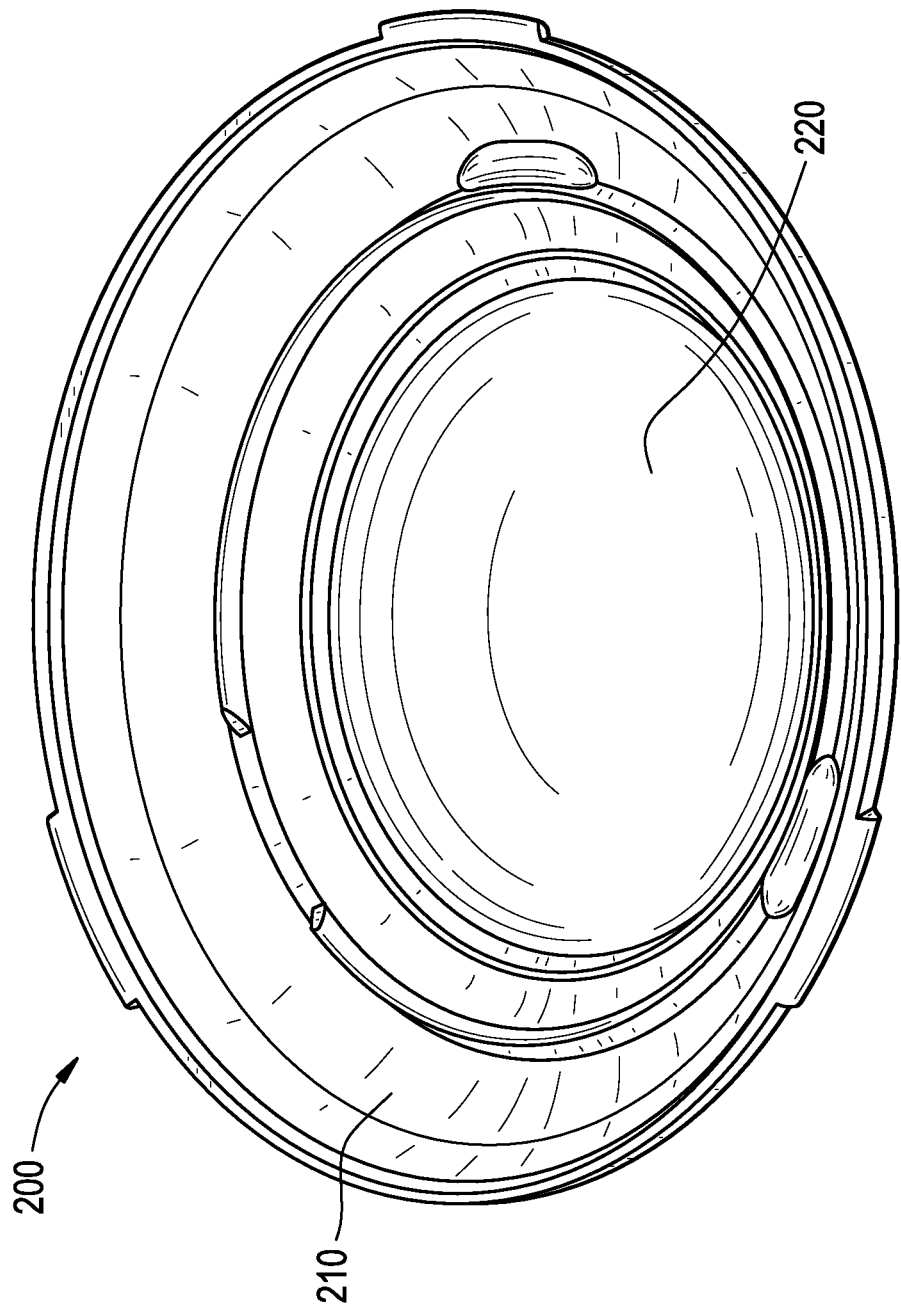
FIG. 2 illustrates an exemplary substrate that may be useful for inclusion in ophthalmic devices and the surfaces upon which interconnections may be configured in accordance with the present invention.

A full representation of an exemplary three dimensional substrate, which may be useful as a component piece of an ophthalmic lens insert is illustrated in FIG. 2 as element 200. The piece has a central zone 220, which in some exemplary embodiments may be related to an optic zone of an ophthalmic device, where light incident on the piece traverses through the piece and into the eye of an ophthalmic device user. As well, the piece may have peripheral regions which are outside the optic zone and may be primary locations for interconnections and devices which may be connected to these interconnections. The peripheral regions are represented by element 210 in FIG. 2. In exemplary embodiments related to ophthalmic uses and inserts into ophthalmic devices, the typical dimensions of a three dimensional piece of the type shown as element 200 may include diameters of between six (6) mm and sixteen (16) mm.

Metallizing a Three Dimensional Shape

Figure 3:
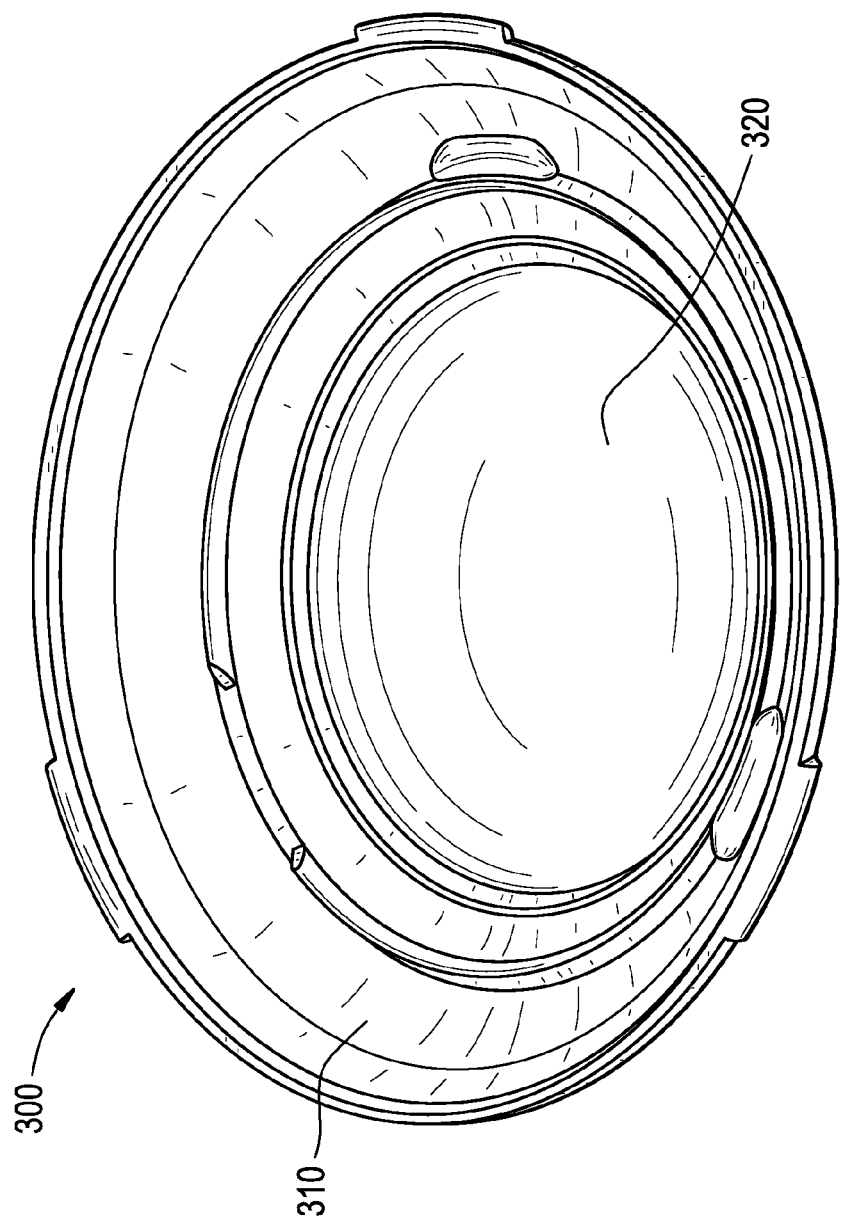
FIG. 3 illustrates an exemplary substrate with surfaces that have been coated with a blanket deposition of a metallic layer in accordance with the present invention.

Referring now to FIG. 3, element 300, a three dimensionally formed substrate of the type depicted as element 200 may be blanket coated with a metallic film. There may be numerous methods to coat such a structure with a metallic film, including vapor deposition, sputter deposition, chemical vapor deposition processing, and plasma enhanced chemical vapor deposition. In additional exemplary embodiments, conductive polymers or adhesives may be applied to; printed upon or sprayed upon the surface to form a layer consistent with forming of electrical interconnects by subsequent processing.

On element 300, the uniform deposition of a conductive film layer upon the three dimensionally formed substrate may be made to occur in a blanket fashion across all surfaces of the feature, or in some exemplary embodiments on all surfaces of one side of a three dimensionally formed substrate. Under these conditions, for exemplary embodiments of an ophthalmic insert, the conductive film may be deposited upon regions in the optic zone of the lens insert, item 320, and also in the peripheral zone of the lens insert, element 310. In an exemplary fashion, the film illustrated in FIG. 3 may be deposited utilizing conventional deposition equipment by sputtering a film of gold, nominally in a range from 0.25 to 1.0 microns in thickness upon the convex surface of a piece of a lens insert having a three dimensional shape as depicted in FIG. 2. The typically high conformality of such a deposition process will allow for thickness variation of the deposited conductive film to be minimized across the three dimensional surface both for the global center to edge dimensional change and for the local geometry changes which may be similar to the element 130 previously discussed relative to FIG. 1. Although sputter deposition may be described in an exemplary fashion, the numerous manners of coating a conductive layer upon an insulative substrate surface and the diversity of materials which may comprise the conductive layers are consistent with the art herein described.

Figure 4:
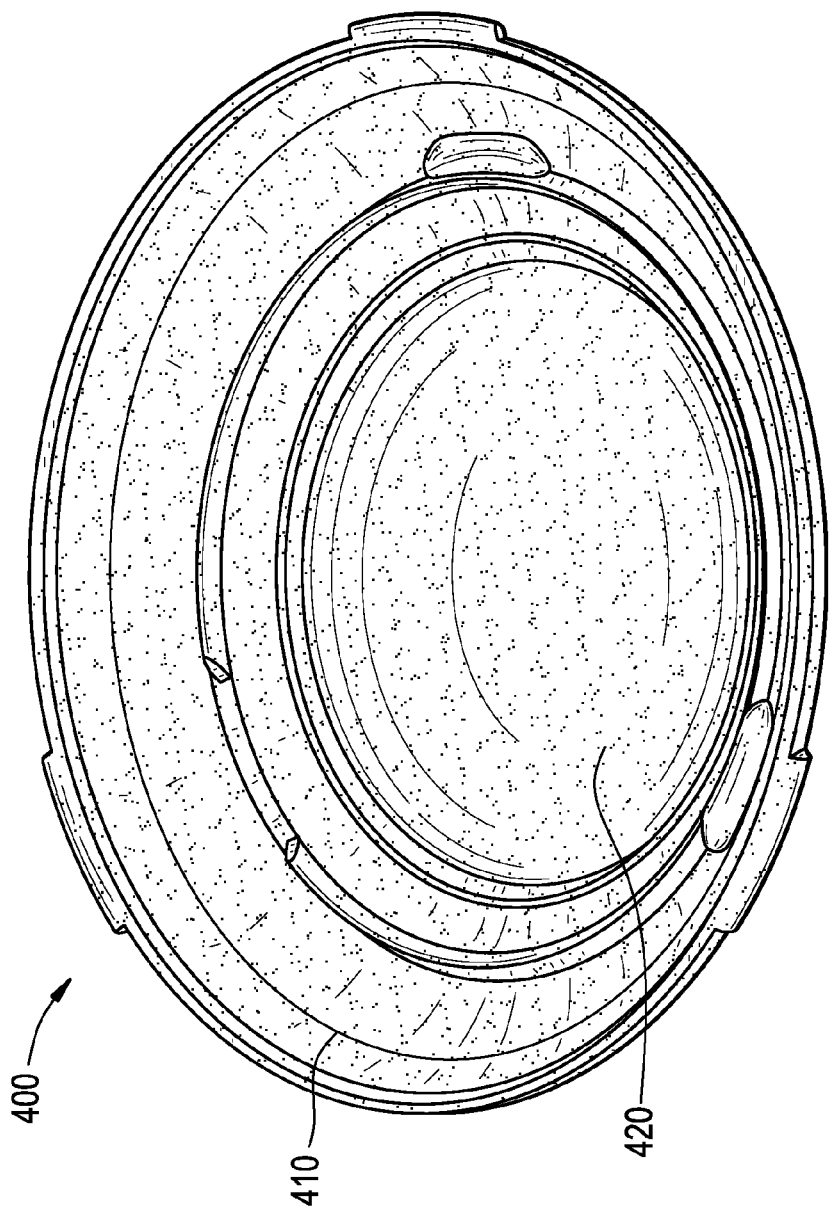
FIG. 4 illustrates an exemplary substrate where selected surfaces have been coated with a blanket deposition of a metallic layer in accordance with the present invention.

In some exemplary embodiments, the conductive films may interfere with the optical quality of a lens device in the region of the optic zone, and therefore in exemplary embodiments of this type the film in the entire region of the optic zone, element 320 will need to be removed in subsequent processing. Since the process of removing the film from such a region, and in some cases the process of depositing the film even before it is removed may result in a degraded optical performance of the surface region, alternate exemplary embodiments may be derived by masking portions of the three dimensional device while the application of conductive films is performed. In subsequent sections of this disclosure, the generation and fabrication of devices to carefully mask regions of a three dimensional substrate is described in detail. Less complicated masks may be useful to block regions of simple shapes like the optic zone of the exemplary device in the region identified by element 120 illustrated in FIG. 1. Turning to FIG. 4, element 400, the result of masking an exemplary three dimensional substrate surface during application of conductive films is illustrated. In region 410, the variety of coating processes previously mentioned may result in surfaces which are covered by the conductive film while in regions like the exemplary optic zone depicted as element 420, where masking is operant, the surface may be unaffected by the processes which coat the three dimensional film with conductive film and be clear.

Figure 5:
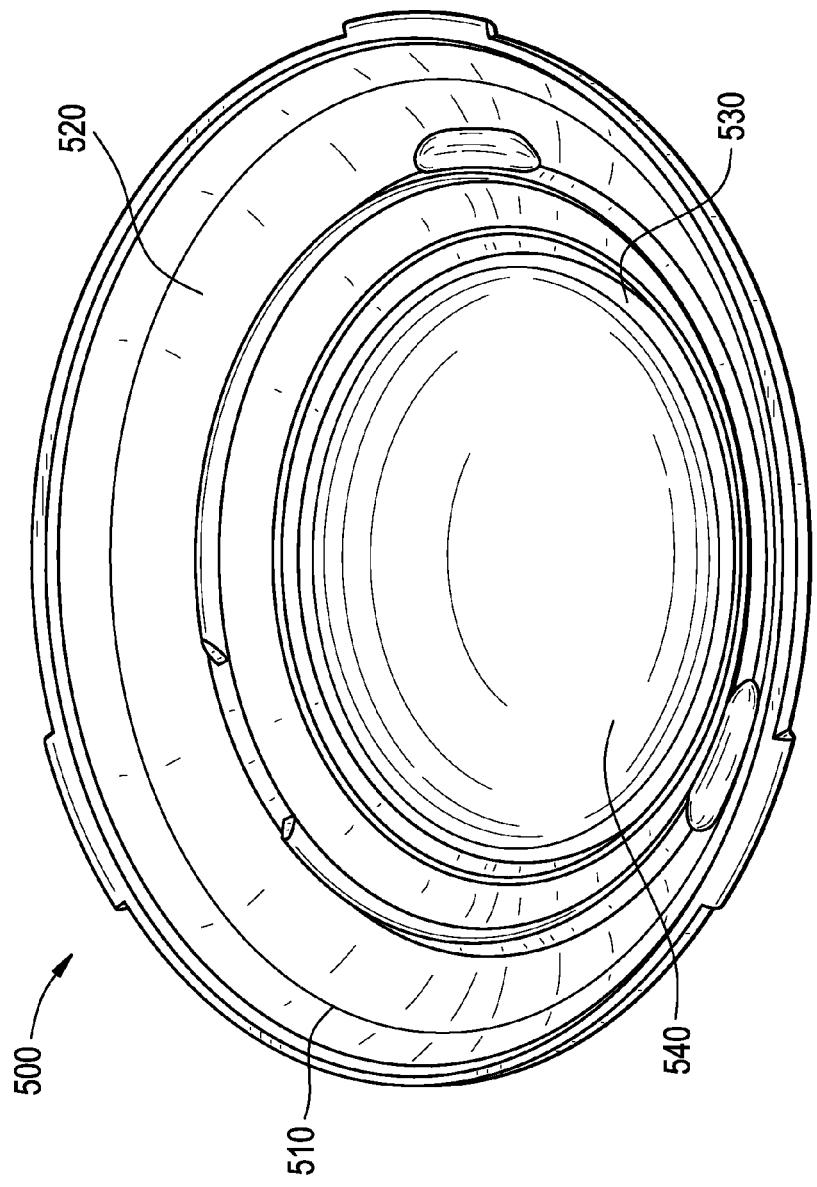
FIG. 5 illustrates an exemplary substrate where a metallic layer is deposited upon portions of the surface in a select shape in accordance with the present invention.

Referring to FIG. 5, element 500, the blocking of multiple regions of the surface of a three dimensional substrate is depicted in an exemplary fashion. In a general sense, simple masks which allow deposition in regions of the three dimensional shapes may result in optimization of the subsequent material removal processes that are used to define interconnection features like lines and pads. In an exemplary fashion, if the interconnection features are limited to a limited portion of the substrate surface, the thin film deposition may be limited to a region surrounding that portion. Elements 510 and 530, in FIG. 5, represent such a case where the coating occurs in the shaded region but does not occur in other surface regions like the exemplary optic zone, element 520 and other surface regions element 540. As opposed to more sophisticated masking apparatuses to be discussed in later sections, where interconnection features may directly be formed in a masking process, the type of masking process for which the results are depicted in FIGS. 4 and 5 globally mask out regions while leaving deposited regions which may be subsequently processed to form interconnection features.

Laser Ablation of Films on a Three Dimensional Shape

In configuring conductive films into shapes that may be useful as interconnection features, a useful processing technique may include laser ablation. In standard tooling solutions commercially available, a laser ablation process uses a high powered laser beam to impinge a surface of a substrate under high speed computer controlled operation to melt and vaporize material at the surface. The substrate may typically be located in a machining configuration that holds the piece and may controllably move the piece in three dimensions. A laser head to control the characteristics of the laser beam and its directionality may focus the laser ablation beam upon the surface of the three dimensional substrate. There may be numerous computer controllable parameters relating to the ablation process which may be selected to perform a process to determine interconnection features. The parameters may include the wavelength, power, pulse-rate and duty cycle of the laser beam. As well, optics may be controlled to select focal characteristics like depth of focus, focal plane, and spot size. As well as controlling the geometric locations of the substrate and the various directional aspects of the laser beam, computer control may select the number of pulses that will occur in a particular location as well as the rate at which the substrate and the laser controls move in space. The laser ablation systems and adaptations to commercially available laser ablation systems may allow for numerous control aspects that may be important in the formation of electrical interconnections on three dimensional surfaces.

Figure 6:
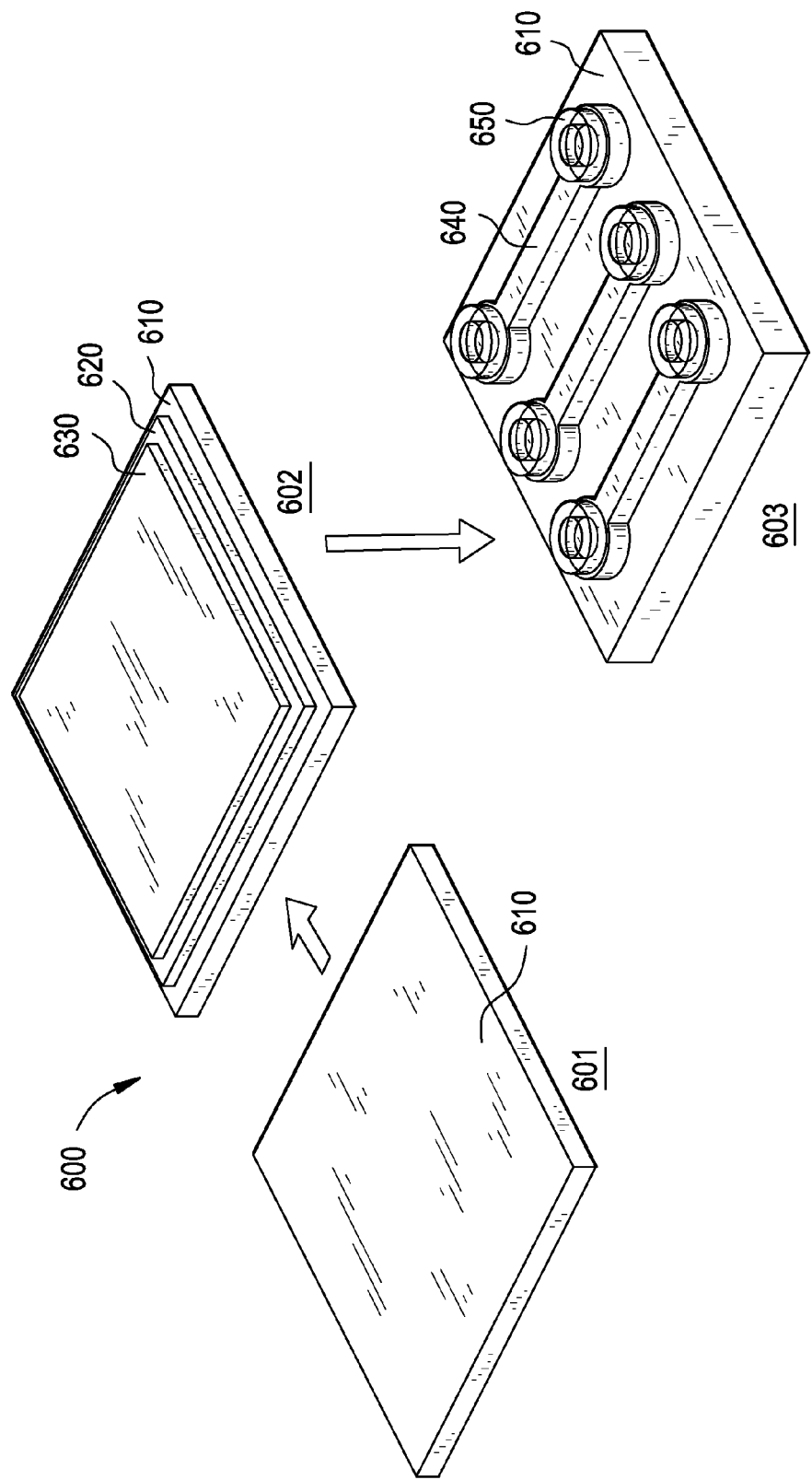
FIG. 6 illustrates exemplary interconnections and insulative layers upon flat surfaces.

Referring to FIG. 6, element 600, an exemplary processing flow to form interconnection features on a more typical flat (non-three dimensional) substrate is depicted. In step 601, a substrate, element 610 may be formed in numerous manners. If the substrate 610 is formed from an electrically insulating material then it may be directly used; however, it is formed of a metallic or conductive material, then an insulating layer may need to be applied. For example, element 610 may comprise a forming compatible plastic like polyethylene terephthalate glycol copolyester (PETG).

Proceeding to step 602, the substrate 610 may be coated with a combination of materials to form layers 620 and 630. In an exemplary embodiment, these films may include metal, dielectric, semiconductor, piezo-resistive, piezo-electric or thermo-electric materials for various purposes. For example, element 620 may be formed by thin film deposition of a gold film upon the PETG substrate 610. In a next deposition step, an insulator film of silicon dioxide may be sputtered upon the gold film to define film 630. It may be apparent that the many material choices as well as the numerous techniques to deposit or form films may be consistent with the inventive art herein.

Proceeding to step 603, the film coated substrate is next processed using the laser ablation technique. By controlling the ablation process across the surface of the substrate one or both of the films may be ablated from the surface. In some regions of the surface, as in where element 610 is indicated, the laser ablation conditions may have been controlled to ablate both film layers upon that location. In other regions, as indicated by element 640, the ablation conditions may be controlled so that only the top exemplary silicon dioxide film is ablated. In still further regions, like that depicted as element 650, the laser beam may not interact with the surface and leave both film layers in their formed location. It may be apparent that an arbitrary set of shapes and combinations of regions with one or more film layers removed may be possible within the state of the art.

Observing the processing result of step 603 as a whole, it may be apparent how such a processing step may yield interconnect related features. The features that are illustrated as a result of step 603 may comprise metal lines to conduct electrical current to components that may be connected through the via type features in the insulator material. As well, lines and contact points may comprise important features for electrical interconnects upon other types of substrates, as for example, three dimensionally formed surfaces.

Figure 7:
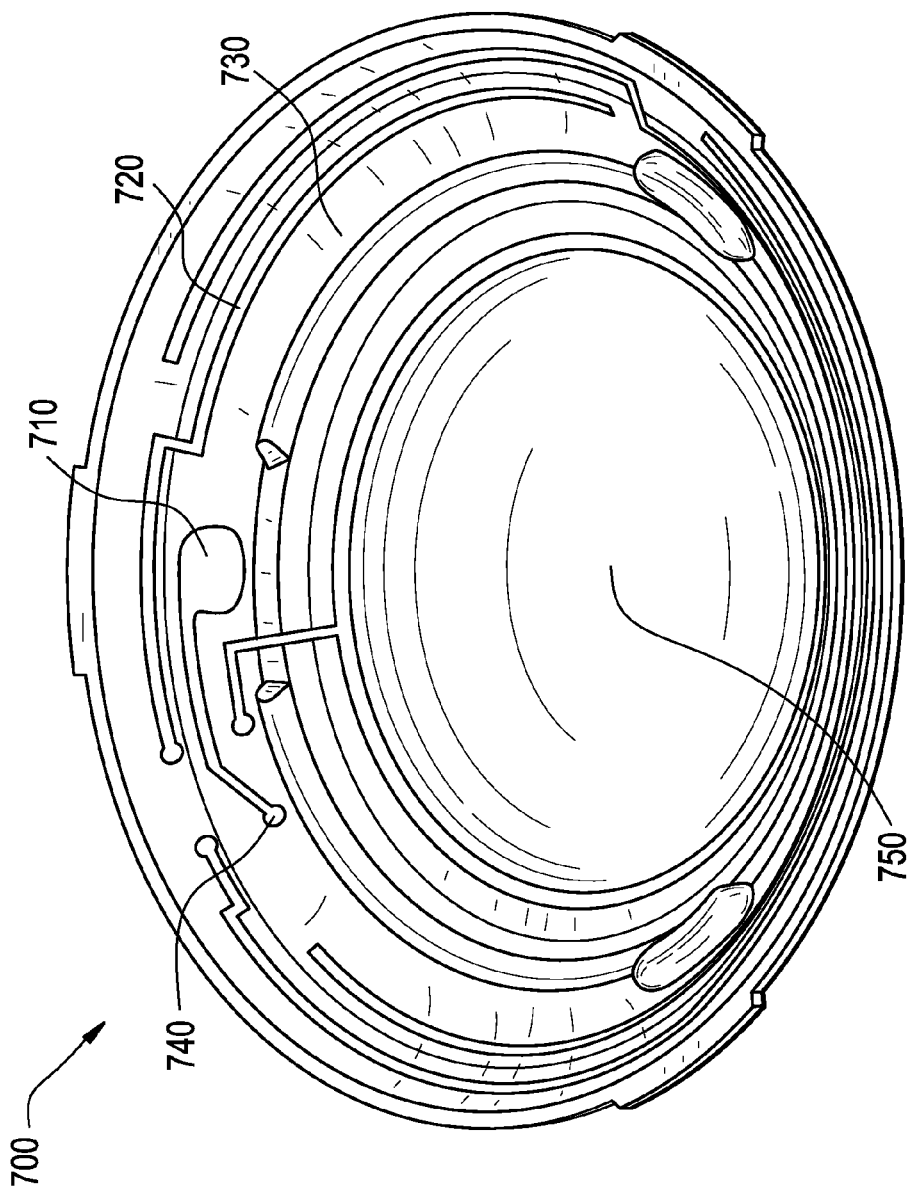
FIG. 7 illustrates a substrate after laser ablation has defined electrical interconnects upon its surfaces in accordance with the present invention.

Referring to FIG. 7, element 700, a result of performing laser ablation upon the metallized substrate described as element 300 in FIG. 3 may be observed. In this example, a laser ablation process has removed significantly all of the deposited conductive film from the substrate. In the optic zone, illustrated as element 750, the conductive film has been removed. It may be apparent, that if that region may be screened from having the conductive film upon the optic zone region in the first place, as is illustrated by element 400 of FIG. 4, there may be improvements both in the rate of processing as well as the quality of the substrate surface in the region. As well, in the peripheral regions significant portions of the deposited film may be removed as shown by the type of region 730. Again, it may be apparent that a screening process, like that for element 500 illustrated in FIG. 5, which may block deposition from large areas where interconnect features are not required, may result in performance improvements.

Nevertheless, there are interconnecting features that are formed as a result of the laser ablation process regardless of which type of coated substrate (300, 400 or 500) is used. Conductive lines may be observed, as for example the feature indicated by element 720. As well, pads of various types may be formed. Element 710 illustrates a large connection pad, whereas element 740 may show a contact pad location as may be useful for interconnection to electrical components. The features and the routings of the various interconnect lines are shown in an exemplary shape and may take different forms for a variety of different needs for interconnection of components along the surface of a three dimensionally formed substrate.

Laser Ablating an Insulation Layer Over Metallization

Figure 8:
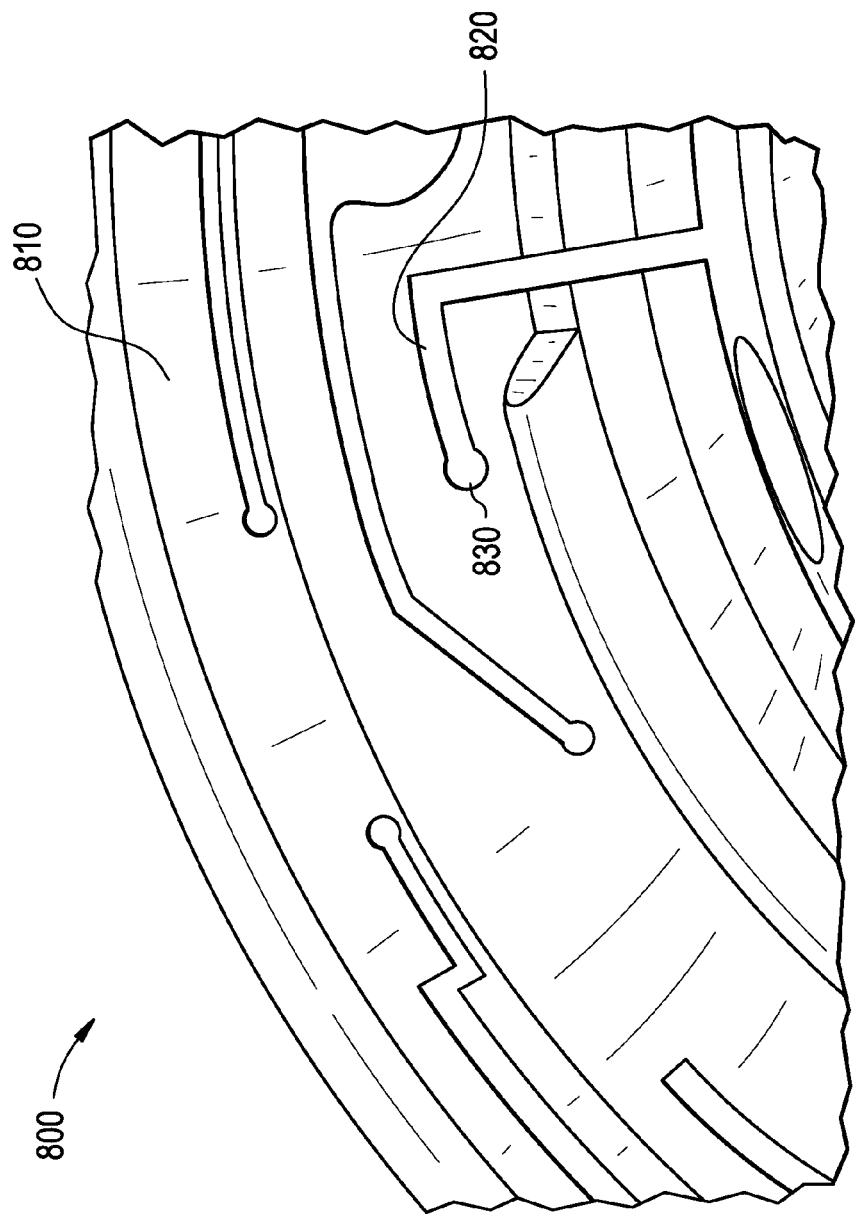
FIG. 8 illustrates a detailed perspective of imaged electrical interconnects where an insulator layer has been applied and subsequently had via opens made through laser ablation in accordance with the present invention.

After metal lines are defined as in the processes described herein, it may be useful in some exemplary embodiments to coat the three dimensional piece with an insulating film to electrically isolate the conductive interconnect features. In this case, again, laser ablation processing may be useful in some embodiments. Precisely located penetrations or vias in the insulating films may be formed by laser ablation of a covering insulating film. In FIG. 8, element 800, a close up of the region of small interconnection pads in the previously described region of element 740 is illustrated. After an insulating film is applied to the three dimensional form with interconnects, over the previously formed lines, element 820, and spaces, element 810, a laser ablation process may open up the holes or vias to define interconnection points as defined by element 830. It may be apparent to one skilled in the relevant art that numerous methods of insulator film deposition and numerous material choices for insulation films may be consistent with the methods and apparatus defined herein.

Using Masks to Directly Form Interconnect Features.

As briefly mentioned in earlier sections, masks, which create regions that are blocked and regions that are open, comprise a useful apparatus to support the methods to form interconnections on three dimensional surfaces. In the previous sections the uses of masks were of limited sophistication; namely, to block or expose large regions. However, particularly with formation techniques of high resolution and precision, a mask may be formed which may be used to directly form interconnect features on the surface of substrates.

Figure 9:
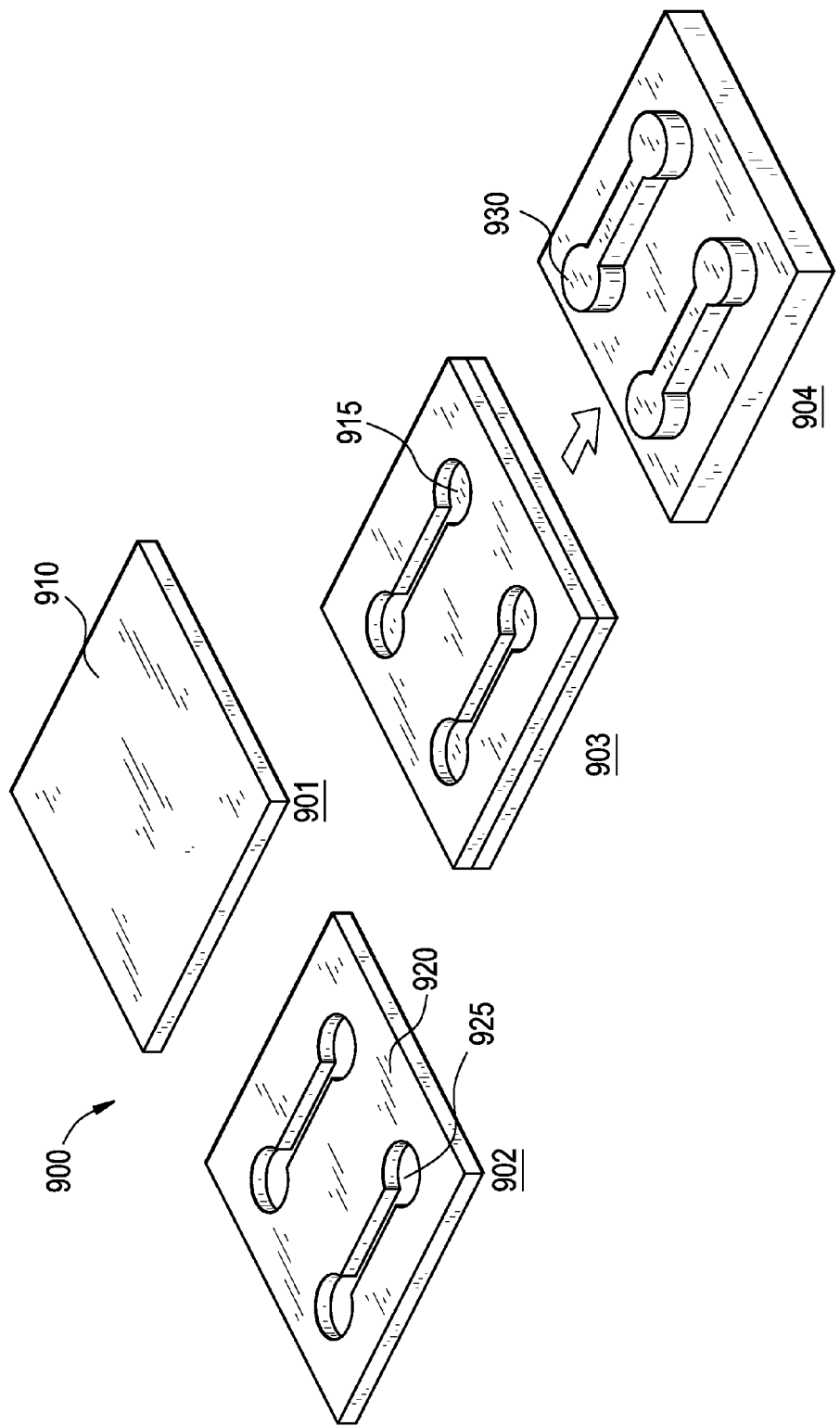
FIG. 9 illustrates exemplary mask elements that may be subsequently utilized to act as shadow masks for the definition of metallic interconnects or insulators on flat surfaces.

For illustrative purposes, FIG. 9, element 900, depicts how a mask, sometimes referred to as a shadow mask in this perspective, may be used to directly form interconnect features during a thin film deposition process. At step 901, an appropriate substrate, 910, may be formed by any of the means already discussed. As mentioned previously, if substrate 910 is not comprised of an insulating surface material, then it may need to be coated with an insulator material as part of the step. The same illustrative substrate material, PETG, may be used to form element 910.

In a separate formation process, step 902, another flat substrate, 920 may be formed into a mask. There may be numerous techniques known in the art that may be used to form the mask product of step 902, including photoresist lithography followed by chemical etching, photoresist lithography followed by mechanical abrasion, photoresist lithography followed by reactive ion etching and similar known processes for the formation of layers with imaged features removed. Another use of the laser ablation process again may result in the formation of masks. If laser ablation is used to eliminate material within the substrate 920 in features such as element 925, a resulting mask with a good level of precision in the shape and location of the features may be formed.

The formed mask may then be utilized in a next process step, 903. The mask is placed upon the substrate 910. In some exemplary embodiments, this placement may be required to occur with alignment to the substrate, that is the x and y location of the mask, 920, relative to the x and y location of the substrate, 910 may be important. Once the mask is aligned as required, at step 903 deposition of a thin film by the variety of techniques that are possible to form them may occur. In an exemplary embodiment, a gold film sputtering process may again be applied for this processing. Wherever the mask has cut out regions like 915, it will allow the gold film deposition to pass onto the substrate. In regions without cut outs, the deposition will occur on the mask, and the mask effectively blocks or "masks" the deposition from occurring on the substrate.

In a next process step 904, the mask 920, is removed from the surface of the substrate 910. In the removal process, the regions which did not block the thin film deposition from attaching to the substrate will now have features, 930, in the shape of the cutout features in the shadow mask 925. It may be apparent how these features may represent line and pad features important to electrical interconnect features.

It may be important in many processes relating to the masking of a thin film deposition or formation process for the mask to be located in very close proximity to the substrate it is masking. When there is space between the mask and the substrate, then depositing material may not be limited to the sharp edges defined in the mask itself but rather assume spread out features approximating the mask defined features. In some designs, for example where parallel lines are placed in proximity to each other or more generally when any features are located in proximity to each other, electrical shorting between these features may result when the deposited features are not sharply defined. Therefore, it may be apparent that when the substrate that needs to be masked is not flat but rather has three dimensional topology that additional complexity may be introduced.

Figure 10:
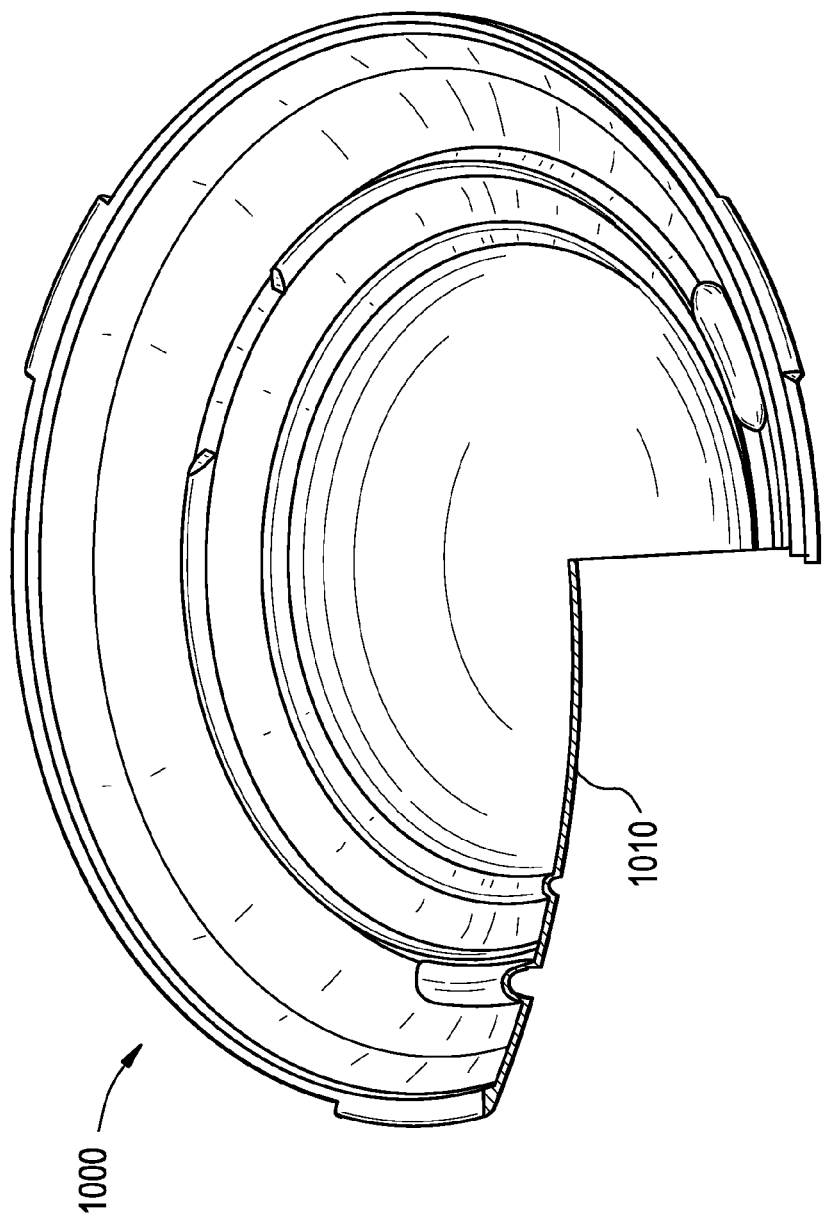
FIG. 10 illustrates an exemplary substrate with three dimensional form in accordance with the present invention.

Referring to FIG. 10, element 1000, a three dimensional feature, which may in some exemplary embodiments be consistent with a component part of an ophthalmic lens insert or an ophthalmic lens body is displayed. The feature has the similar aspects of local and global topology as that discussed in reference to FIG. 1. This three dimensional substrate has the physical form referred to by reference to element 1010. In preparing a shadow mask for the definition of interconnects upon the surface of element 1010 considering the principle that a shadow mask should be located very closely to the substrate it is masking, it may be apparent that a formation process that is nearly identical to the formation of the substrate piece may be useful. Without a loss of generality, there may be numerous processes that may be used to form the structure of the mask including forming, electroforming, thermo-compression molding, injection molding, stereo-lithography and voxel based lithography. Furthermore, while in some exemplary embodiments, the design may benefit when the mask closely resembles the topologic shape of a substrate it will be used to process there may be numerous embodiments where a mask need only approximate the three dimensional shape of the substrate and still be useful in processing. It may be clear to one skilled in the art that numerous shapes of masking apparatus relative to the shape of a substrate may comprise art within the scope of this inventive art.

Figure 11:
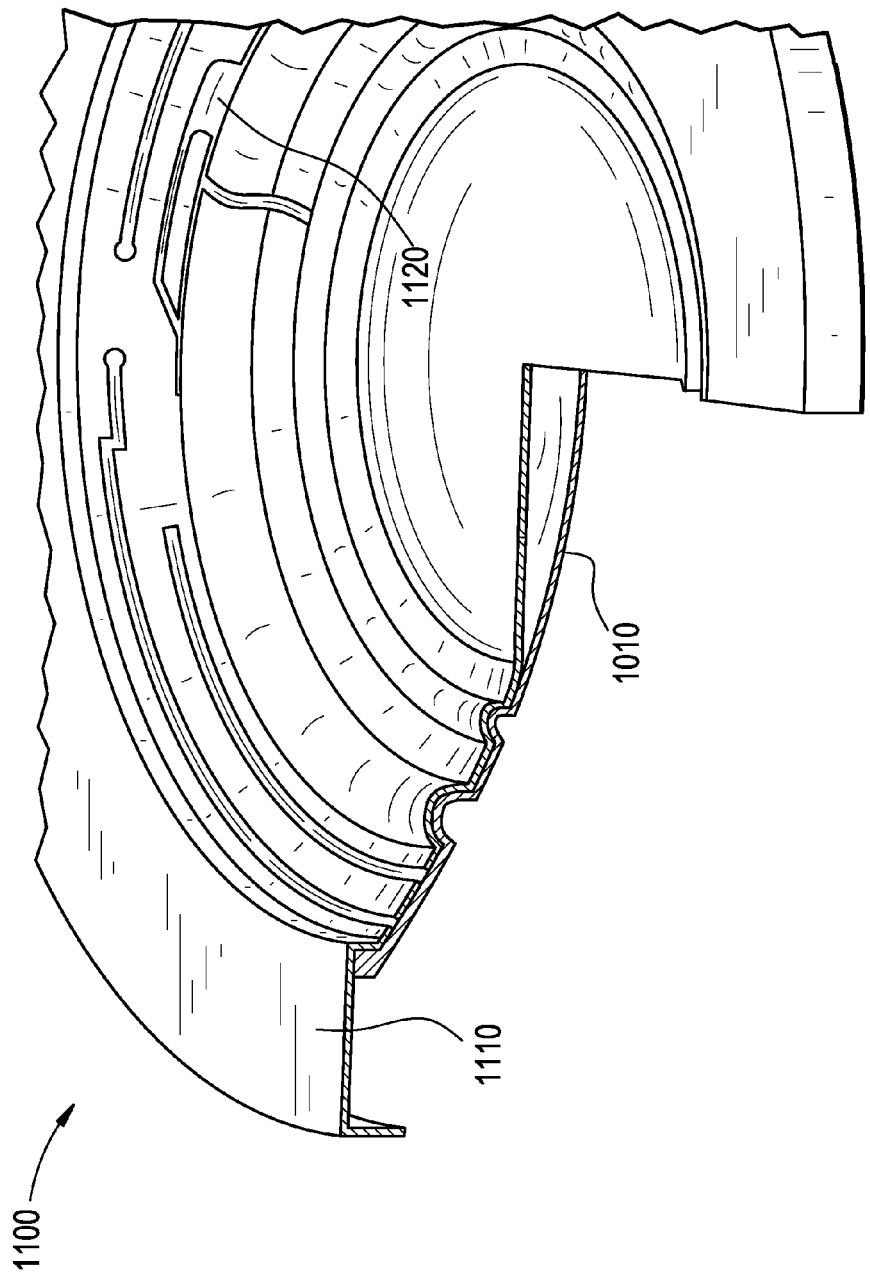
FIG. 11 illustrates an exemplary shadow mask mating with the exemplary substrate in accordance with the present invention.

Referring to FIG. 11, element 1100, a superposition of a mask 1110 which has been formed with three dimensional topology that is similar to the underlying substrate 1010 is depicted. As illustrated in the drawing, the shape of features of the mask 1110 may be arbitrary, when the shadow mask is larger than the substrate 1010, in regions where the mask 1110 is larger or exceeds the bounds of the substrate 1010. Now that a close formed and shaped shadow mask has been created it will need to have precisely defined and formed penetrations in its form to allow for conductive film material to be deposited on the underlying substrate in precise locations. There may be numerous manners that may be used to create these penetrations, shown for example as element 1120. However, again laser ablation may define a useful processing alternative to forming the non-masked regions. In similar fashion to what has been discussed in reference to step 902, the laser ablation tooling may be used to ablate material in precise locations of the mask body 1110. It may be apparent to one skilled in the art that the numerous parametric setups, programming options and equipment diversity possible for laser ablation processing comprise art within the scope of the present invention. Furthermore, it is also possible within the art herein to define the mask penetrations by means other than laser ablation.

Figure 12:
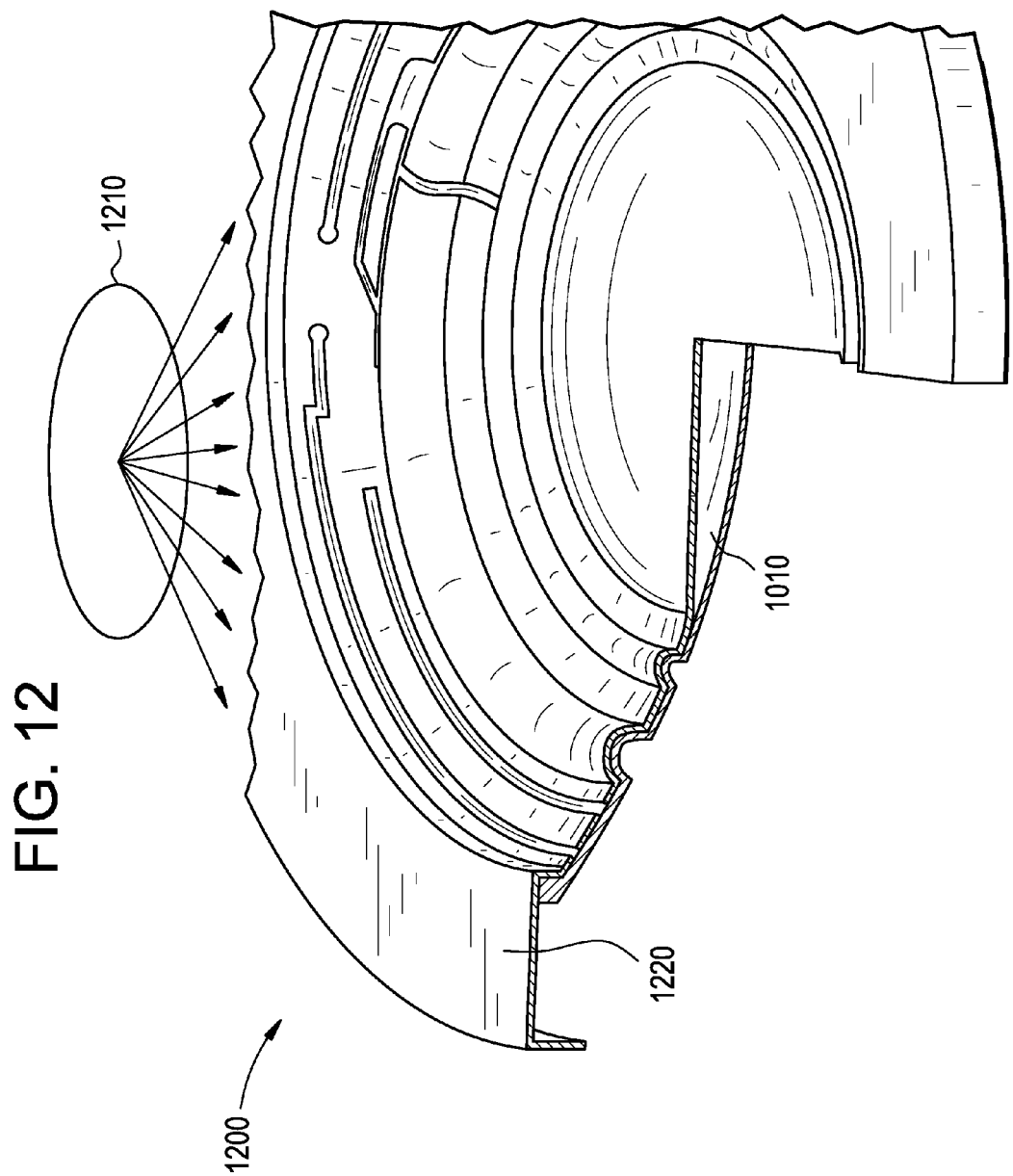
FIG. 12 illustrates a metal deposition process coating the combined exemplary three dimensional substrate and covering shadow mask in accordance with the present invention.

Once the mask 1110 has been formed with its associated penetrations 1120 and is then aligned and placed upon its matching three dimensional substrate, the shadow masking process may be performed. Referring to FIG. 12, element 1200, an attached mask and substrate entity 1220 is depicted in the environment of a thin film deposition environment 1210. Although deposition environment 1210 may comprise any of the numerous discussed techniques for thin film formation, such as the sputter deposition of a gold film, it should be noted that there may be numerous films that may be consistent with masked deposition, including, metallic films, dielectric films, high-k dielectric films, conductive and non-conductive epoxies and other conductive and non-conductive films which may be applied by spraying processes. Furthermore, in each of these categories there may be a wide diversity of consistent materials that apply to the formation of useful films within the scope of this art, without limiting this general scope, some materials of particular interest may include Indium Tin Oxide (ITO), Graphene, and carbon nanoparticles and nanofibers.

Figure 13:
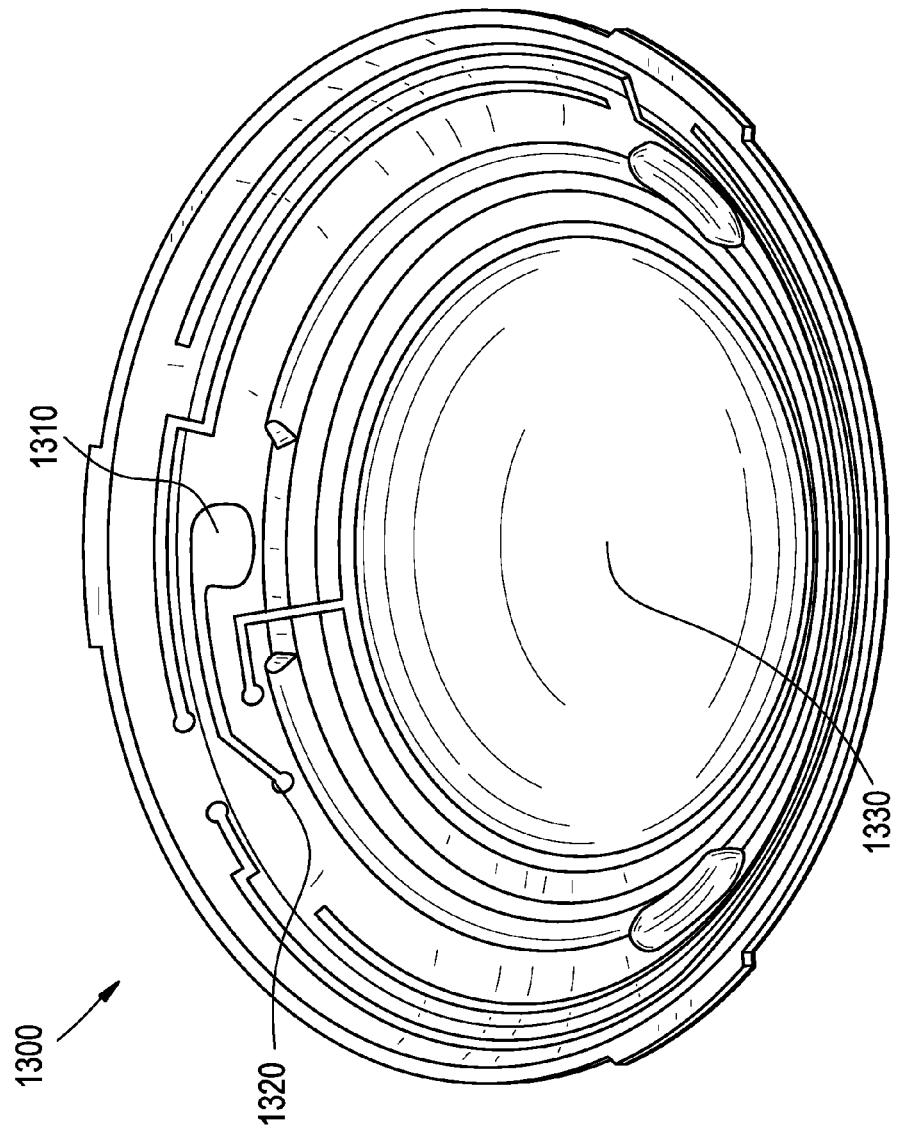
FIG. 13 illustrates resulting interconnects which have been defined by the deposition of metallic films through openings in a shadow mask and onto surfaces of an exemplary three dimensionally formed substrate in accordance with the present invention.

After the deposition process has been performed to deposit an appropriate thickness of gold film onto the mask body and onto the substrate in regions of the mask where penetrations have been placed, a resulting product of a substrate with directly formed interconnections may be produced as illustrated in FIG. 13, element 1300. The mask has directly shadowed the three dimensional substrate in regions where interconnects are not required, as for example in the optic zone location depicted as element 1330. In the regions of penetration in the shadow mask, interconnect features may be formed upon the surface of the substrate, as in element 1310.

After interconnect features have been defined in the manner described, in some exemplary embodiments laser ablation processing may again be used. If the features defined by a shadow mask are not of a precision that may be obtained with laser ablation, the defined features may be "trimmed" or further defined through the use of laser ablation. In some exemplary embodiments, such trimming may result in improvements in throughput, since features very close to the desired finished product may be formed by shadow masking and then changed in small manners by laser ablation.

Another potential use of laser ablation consistent with the art herein may be in the repair of substrates that have been formed by the various methods herein. If a defect of some kind has been formed or created during processing and is detected in a manner after production is completed, in some exemplary embodiments the defect may be altered or removed through the use of laser ablation.

Figure 14:
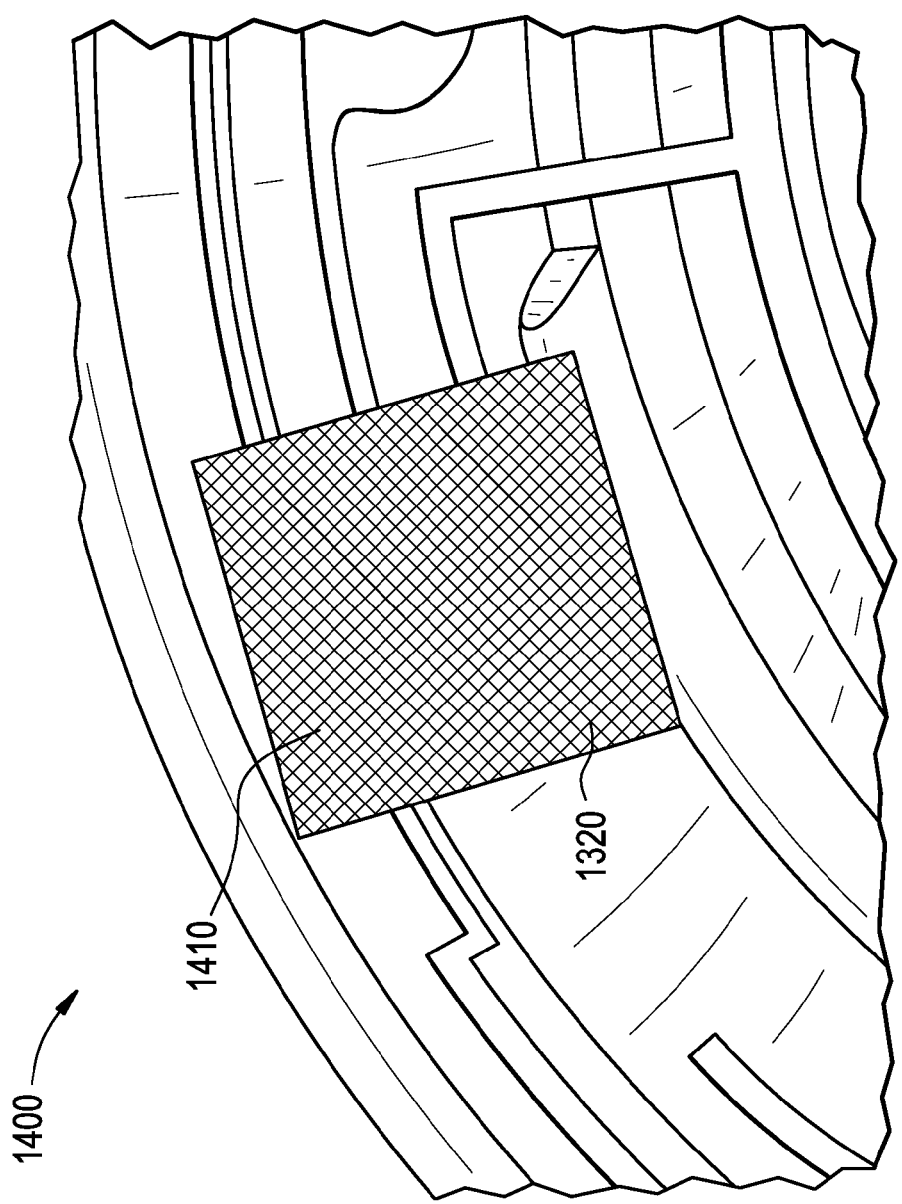
FIG. 14 illustrates how electrical components may be affixed and connected to the surface of an exemplary three dimensionally formed substrate in accordance with the present invention.

As previously discussed, a substrate of the type depicted in FIG. 13 with defined metal interconnects may be subsequently coated with insulative films. Again, among the numerous processes that may be useful to create vias in pads that may be attached to components, the features in the region identified as element 1320 may be processed with laser ablation to open vias in an analogous manner as that discussed in relation to FIG. 8. The precision of the laser ablation processing may create via openings in the insulative material that may correspond directly with interconnections that may occur, for example in an integrated circuit component. Such a component, or the many other types of electrical components that may be attached to conductive interconnections may be directly attached to the substrate at via openings above the imaged interconnect features. Element 1400 illustrated in FIG. 14 depicts an attached component element 1410 where the component electrical connections have been connected to the appropriate via openings to underlying interconnects. Element 1320 represents the underlying region where a component interconnection is attached and electrically connected to a formed electrical interconnect on the surface of a three dimensionally formed substrate. There may be numerous means and methods to connect a component interconnect to an interconnect pad on the surface of a three dimensional substrate including solder interconnections and conductive adhesive interconnections.

Additional Methods for the Deposition or Definition of Interconnect Features

The description above has focused on particular exemplary means of forming interconnect features on the surfaces of substrates. Without a loss of generality, it is important to include a number of other techniques as consistent with the formation of interconnect features which may also derive benefit from the techniques discussed herein or may define alternate exemplary embodiments of the art. Ink jet printing, where a particle, typically in liquid form, containing materials consistent with the conductive and non-conductive features that have been discussed is directly sprayed upon the substrate in a defined pattern may define interconnect features and characteristics of importance. Similarly, aerosol jet printing where a focused stream of atomized particles is directed against a substrate may be consistent with the art herein. Pad printing, where a two dimensional printed feature is transferred to a three dimensional substrate may also define methods consistent with the art herein.

Previous discussions have also described how laser ablation may be used to directly remove conductive film material and thus define interconnect features. There may be other processing methods that process such films in a similar manner which may be consistent with the art described herein. A particular example may be processing via focused ion beam milling. In this case, ionic chemical species are directed at high energy to erode surface material instead of the photons that are useful in laser ablation. It may be obvious to one skilled in the art that numerous processes which may erode films in a directionally controllable fashion comprise art consistent with the invention herein.

Forming a Three Dimensional Shape Simultaneously with Electrical Interconnects and Post Processing with Laser Ablation.

Figure 15:
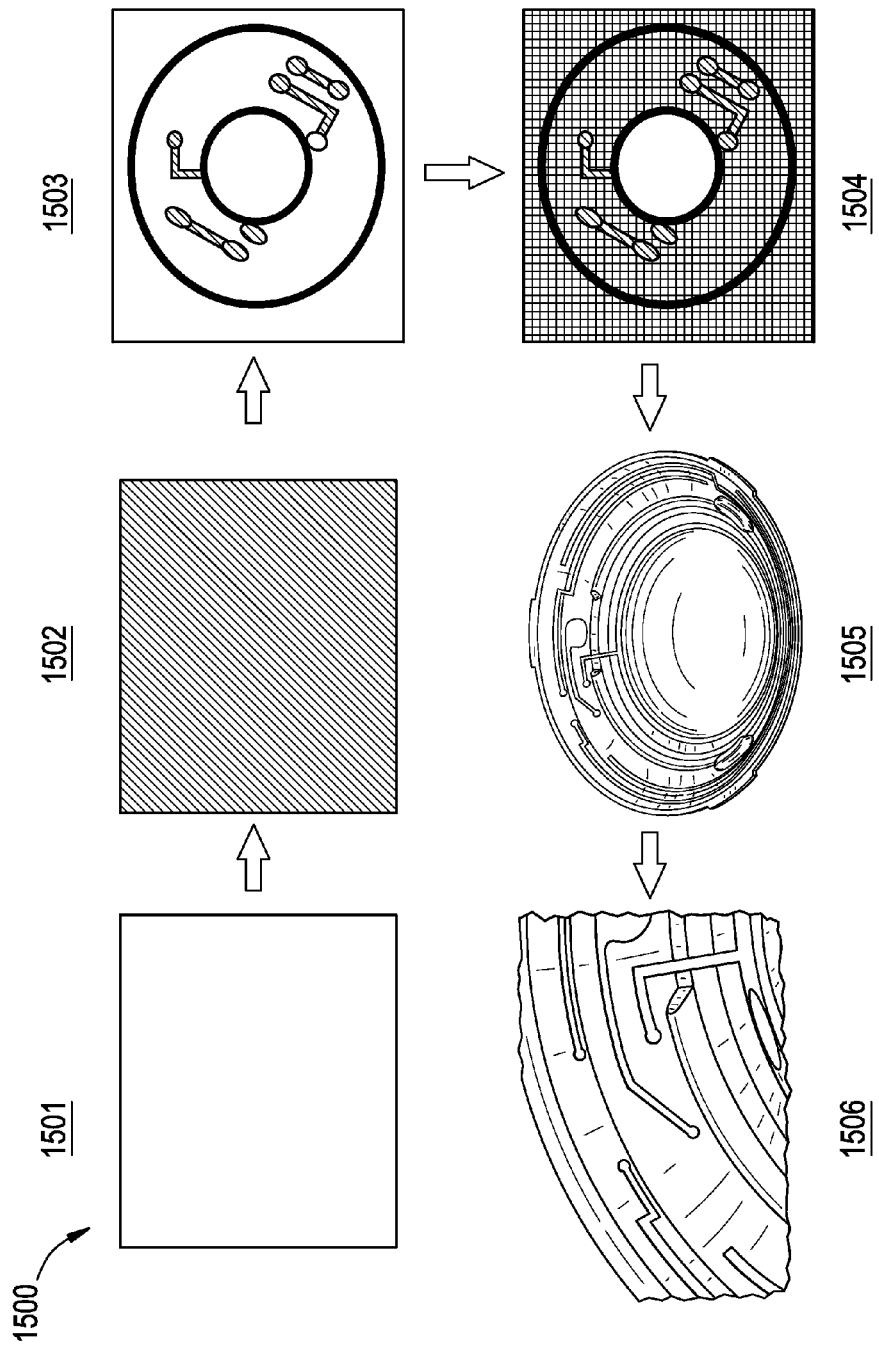
FIG. 15 illustrates a first exemplary set of states of interconnect formation in accordance with the present invention.

An alternate set of exemplary embodiments may be described with reference to FIG. 15, element 1500. In these alternate exemplary embodiments, a set of conductive features which will after processing become interconnects on a three dimensional surface are formed while base materials are still kept in a planar shape. Proceeding to step 1501, a base substrate, which in some exemplary embodiments may be consistent with forming a part of an ophthalmic lens or lens insert, is formed. There may be a large number of materials that would be consistent with a base substrate; however, the material may include PETG as previously discussed. Should the base substrate be formed from a conductive material, it would need to have its surface coated with an insulator material to remain consistent with the formation of interconnects on its surface.

As the substrate base is further processed, in step 1502, a conductive film is applied upon the base substrate. The varied diversity of conductive film types discussed previously may comprise alternates consistent with the art herein defined. In some exemplary embodiments, since the conductive film will be deformed as the flat substrate base is formed into a three dimensional substrate the film may be formed of a malleable conductive material and of a sufficient thickness to avoid mechanical failure during the later forming processes. However, as an example, the film may comprise of a gold film.

In step 1503, the conductive film may be patterned into a shape that will form a desired shape after the flat pieces are formed into three dimensional shapes. The depicted shapes are meant only for reference to that set of shapes that would form the three dimensional desired result. There may be numerous means and processes to pattern the gold conductive layer, or in a more general sense any conductive layer. In a non-limiting sense photolithography with chemical etching may comprise an example of such a process. Alternately, laser ablation may be used in the manners previously describe to create appropriate shaped features during this step.

In step 1504, in some exemplary embodiments the stack of the base substrate with overlying conductive features may be encapsulated in an overlaying material. In some exemplary embodiments, a forming material, like PETG may provide an exemplary film that could be used in this manner. Since the stack of films may be deformed in a forming process to result in a desired three dimensional shape, in some exemplary embodiments the encapsulation of the formed features may result in necessary stability of the features during forming processes to create three dimensional shapes. In some exemplary embodiments, a first planar forming process may occur as part of step 1504 to seal the overlaying insulative material to the underlying substrate base and also to the defined features in the conductive film. Additionally, since the central optic region may perform better without a composite film being used to form it, for exemplary purposes a cutout for the central optic zone region is illustrated by the non-shaded central circular region.

In step 1505, the stack of base material, formed conductive features and overlaying encapsulating and insulating layer may be subjected to a forming process to result in a three dimensional shape with the shape and incorporated electrical interconnects resulting from the forming process. In some exemplary embodiments where the processing in step 1504 included an overlying insulating layer, vias may need to be formed into the insulating material. In step 1506, the three dimensional shape with incorporated electrical interconnects is processed in a manner to create electrical conductive vias and openings at appropriate locations. There may be numerous means and methods to create these vias and openings; however, laser ablation processing may be used to precisely create openings by ablating the top insulator layer thereby exposing an underlying conductive film area. The resulting three dimensional surface with electrical interconnects may be significantly similar to that produced in other manners discussed herein.

Forming a Two Dimensional Mask, Folding the Two Dimensional Mask into a Three Dimensional Shape and Forming Interconnect Features.

Figure 16:
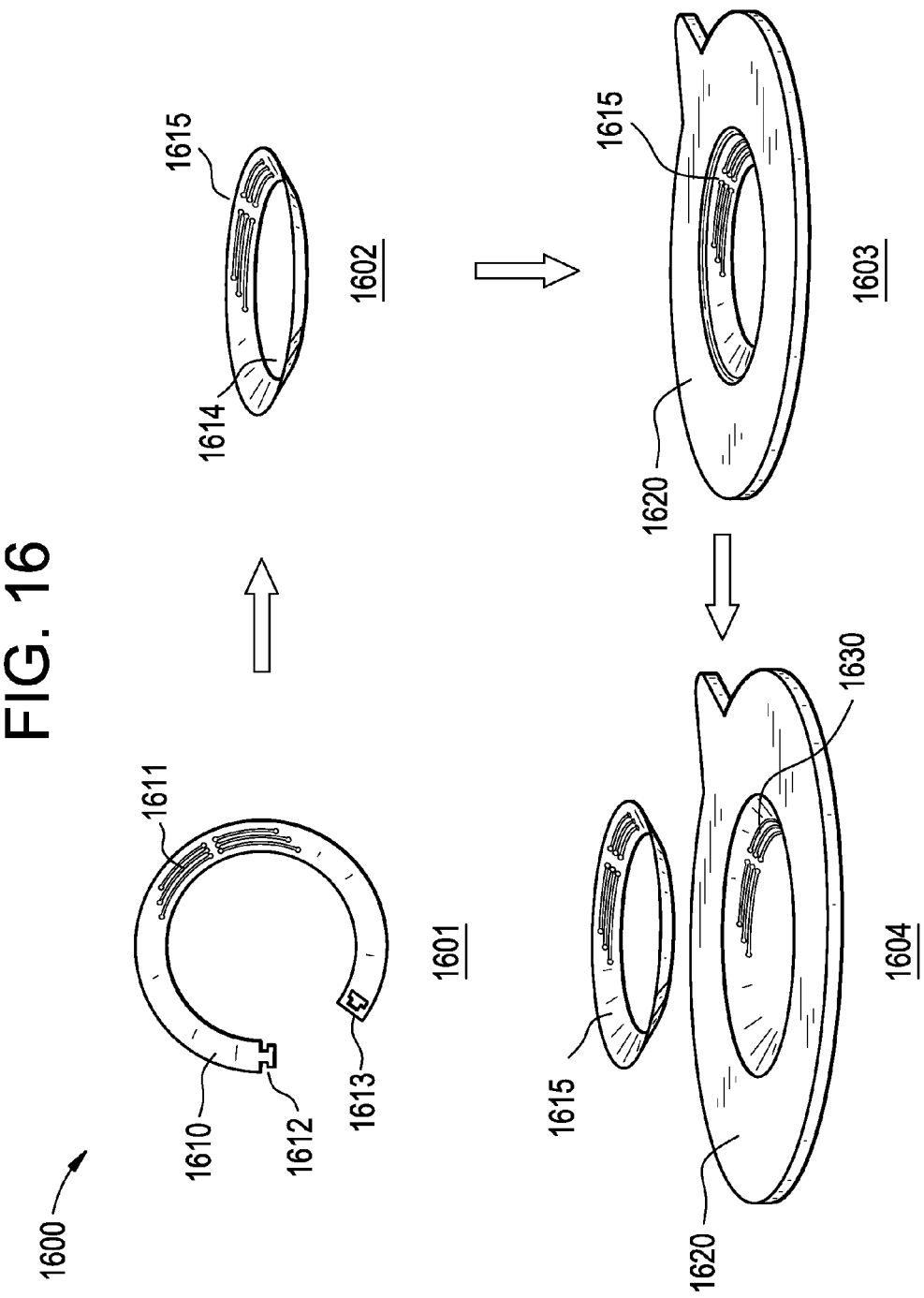
FIG. 16 illustrates a second exemplary set of states of interconnect formation in accordance with the present invention.

Proceeding to FIG. 16, element 1600, an alternate method of forming interconnect features on three dimensional substrates through use of a masking technique is demonstrated. In analogous fashion to previous discussions relating to the formation of two dimensional masks in step 902, in a separate formation process, step 1601, a flat substrate may be formed into a mask template 1610. There are numerous techniques known in the art that may be used to form the mask product of step 1601, including photoresist lithography followed by chemical etching, photoresist lithography followed by mechanical abrasion, photoresist lithography followed by reactive ion etching and similar known processes for the formation of layers with imaged features removed. Another use of the laser ablation process again may result in the formation of masks. If laser ablation is used to eliminate material within the substrate in features such as element 1611, a resulting mask with a good level of precision in the shape and location of the features may be formed. There may be many materials that may be consistent with the formation of a mask template of the type depicted as 1610 including thin films of metal or plastic. In an exemplary element 1610 may be formed from a thin layer of Mylar capable of being folded without significant local distortion or bending.

Proceeding to step 1602, the mask template is formed into a three dimensional mask by joining the two end pieces 1612 and 1613 into a single connected entity 1614. The deformation of the two dimensional shape to join the ends results in a three dimensional form of the mask, element 1615. When precisely designed, the resulting folded mask shape may be made to closely fit the global topology of a three dimensional substrate.

Proceeding to step 1603, the mask template may now be aligned and mated to a corresponding three dimensional substrate, 1620. The mask is placed upon the substrate 1620. In some exemplary embodiments, this placement may be required to occur with alignment to the substrate, that is the x and y location and axial rotation of the mask, 1615, relative to the x and y location and axial rotation of the substrate, 1620. Once the mask is aligned as required, at step 1603 deposition of a thin film by the variety of techniques that are possible to form appropriate films may be utilized. While the previously described diversity of materials that may be applied in a masking process is consistent with this step, in an exemplary embodiment, a gold film sputtering process may again be applied for this processing. Wherever the mask has cut out regions 1611, it will allow the gold film deposition to pass onto the substrate. In regions without cut outs the deposition will occur on the mask, and the mask effectively blocks or "masks" the deposition from occurring on the substrate.

In a next process step 1604, the mask 1615, is removed from the surface of the substrate 1620. In the removal process, the regions which did not block the thin film deposition from attaching to the substrate will now have features, 1630, in the shape of the cutout features in the shadow mask, 1611. It may be apparent how these features may represent line and pad features important to electrical interconnect features. Furthermore, any of the other processing steps that have been described relating to a substrate upon which electrical interconnects have been defined, including for example deposition of an overlying insulator film and subsequent opening of via connections may describe consistent art within the scope of this invention when combined with the processing steps 1601, 1602, 1603 and 1604.

Although shown and described is what is believed to be the most practical and preferred embodiments, it is apparent that departures from specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. A method for forming electrical interconnects upon a three dimensional surface comprising:
   forming an essentially planar first substrate from a first insulating material;
   forming a single three dimensional substrate from the essentially planar first substrate, the single three dimensional substrate being curved in three-dimensions, forming a substantially dome like structure with an edge to center rise in height of up to 4 mm and including locally raised features, including ridges with side walls having slopes of 2 to 90 degrees, ranging in height from about 0.001 to about 0.5 mm within the dome like structure, the single three dimensional substrate being between six and sixteen millimeters in diameter;
   forming masking penetrations in the planar first substrate by removing regions of first insulating material;
   forming a planar mask template with two free ends by cutting said planar mask template out of the planar first substrate;
   folding the planar mask template by joining the two free ends to create a three dimensional mask having the shape of a semi-conical ring of a dome like structure;
   placing the three dimensional mask upon a three dimensional substrate;
   depositing a conductive film upon the combined three dimensional mask and three dimensional substrate;
   depositing a first insulative film onto the three dimensional substrate over the deposited conductive film;
   opening electrical contact vias into the first insulative film by laser micromachining; and
   incorporating the three dimensional substrate with electrical interconnects into at least one of an ophthalmic lens or an insert for an ophthalmic lens.

\* \* \* \* \*